United States Patent
Ikin

(12) 
(10) Patent No.: US 6,573,787 B2
(45) Date of Patent: Jun. 3, 2003

(54) ELIMINATION OF NOISE DURING POWER SUPPLY SWITCHING IN AN AUDIO AMPLIFIER CIRCUIT

(75) Inventor: Bruce Ikin, Basingstoke (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

(21) Appl. No.: 10/060,654

(22) Filed: Jan. 30, 2002

(65) Prior Publication Data

US 2002/0101282 A1 Aug. 1, 2002

(30) Foreign Application Priority Data

Feb. 1, 2001 (GB) ............................................. 0102637

(51) Int. Cl.[7] ................................................. H03F 1/14
(52) U.S. Cl. ............................. 330/51; 330/9; 330/150; 381/94.5
(58) Field of Search ............................. 330/9, 51, 150; 381/94.5, 120, 121

(56) References Cited

U.S. PATENT DOCUMENTS

| | | | |
|---|---|---|---|
| 4,429,281 A | * | 1/1984 | Ito et al. ........................ 330/9 |
| 4,543,546 A | * | 9/1985 | Hariharan ..................... 333/173 |
| 4,546,324 A | * | 10/1985 | Bingham et al. ............... 330/9 |
| 4,988,952 A | * | 1/1991 | Sevastopoulos et al. ...... 330/51 |
| 5,028,893 A | * | 7/1991 | Marrah et al. ............... 333/173 |
| 5,642,076 A | | 6/1997 | Naokawa et al. |

FOREIGN PATENT DOCUMENTS

EP 0 425 745 5/1991

* cited by examiner

*Primary Examiner*—Henry Choe
(74) *Attorney, Agent, or Firm*—Frommer Lawrence & Haug LLP; William S. Frommer

(57) ABSTRACT

An audio amplifier circuit comprises a voltage-gain amplifier and a current-gain amplifier in series between an input node and an output node. Power supply lines are provided for providing power to the audio amplifier circuit. An outer negative feedback loop is provided around the current gain amplifier and the voltage gain amplifier, and an inner negative feedback loop is provided around the voltage gain amplifier. A first switch is provided for selectively connecting the power supply lines to the current-gain amplifier. A second switch is provided for selectively switching the inner negative feedback loop or the outer negative feedback loop to the voltage-gain amplifier. A control circuit is also provided to control the switches during power supply switching.

24 Claims, 2 Drawing Sheets

ELIMINATION OF NOISE DURING POWER SUPPLY SWITCHING IN AN AUDIO AMPLIFIER CIRCUIT

BACKGROUND OF THE INVENTION

The present invention relates an audio amplifier circuit. In particular, it relates to the elimination, or at least reduction, of audible noise when power is supplied to or removed from an audio amplifier circuit.

Many audio amplifier circuits generate an audible sound when power is supplied to or removed from the audio amplifier circuit. Typically this noise is audible as a popping sound. It would be desirable to eliminate or at least reduce this noise.

A known audio amplifier circuit 1 for eliminating audible noise during system power on or off is shown in FIG. 1. The audio amplifier circuit 1 is implemented on an integrated circuit chip 2 and amplifies signals supplied to the input terminal 3. The output terminal 4 is connected to the load 5 through a capacitor 6 which is provided for DC isolation of the audio amplifier circuit 1.

For the elimination of noise, a node 7 between the external capacitor 6 and the load 5 is connected to earth through a switch 8 which is open during normal operation. Prior to the power being supplied to, or removed from, the audio amplifier circuit 1, the switch 8 is closed. Thus any noise signal generated subsequently in the audio amplifier circuit due to power supply switching is shorted through the switch 8 to earth and is consequently not passed as audible noise to the load 5.

However, the need to provide an external switch 8 externally of the integrated circuit 2 is disadvantageous. Firstly, the external switch 8 itself increases the circuit scale as an additional component is required. Secondly, the external switch 8 complicates the design of the overall circuit because of the need to control switching of the external switch 8 and to synchronize with the switching of the power supply to the integrated circuit 2.

It would be desirable to eliminate, or at least reduce, audible noise during power supply switching of an audio amplifier circuit without requiring the provision of an external switch.

SUMMARY OF THE INVENTION

According to a first aspect of the present invention, there is provided an audio amplifier circuit comprising: a voltage-gain amplifier and a current-gain amplifier in series thereafter between an input node and an output node; power supply lines for supplying power to the audio amplifier circuit; an outer negative feedback loop around the current-gain amplifier and the voltage-gain amplifier; an inner negative feedback loop around the voltage-gain amplifier, the current-gain amplifier being outside the inner feedback loop; first switch means for selectively connecting the power supply lines to the current-gain amplifier; second switch means for selectively switching the inner feedback loop or the outer feedback loop to the voltage-gain amplifier; and a control circuit arranged to control the switch means during power supply switching, wherein the control circuit is arranged to control the switch means when power is supplied by: initially opening the first switch means to disconnect the power supply lines from the current-gain amplifier; switching the second switch means to switch the inner feedback loop to the voltage-gain amplifier and subsequently, after a delay sufficient to allow the output of the voltage-gain amplifier to stabilise, closing the first switch means to connect the power supply lines to the current-gain amplifier; and switching the second switch means to switch the outer feedback loop to the voltage-gain amplifier.

As power is not supplied to the current-gain amplifier for an initial period sufficient for the output of the voltage-gain amplifier to stabilise, the settling transient of the voltage-gain amplifier is not output to the output node of the audio amplifier circuit. Of course it is subsequently necessary to switch the current-gain amplifier on. This is performed with the current-gain amplifier in open loop because the inner-feedback loop which does not include the current-gain amplifier is at that time switched to the voltage-gain amplifier. As a result, the supply of power to the current-gain amplifier does not create audible noise because its high bandwidth causes any transients to be above the audible range. In contrast, if the current-gain amplifier was in the feedback loop with the voltage-gain amplifier, the low bandwidth of the voltage-gain amplifier would slow the power-up creating audible noise. Subsequently, the outer-feedback loop is switched to the voltage-gain amplifier for normal operation with a feedback loop around both amplifiers.

Preferably, the audio amplifier circuit further comprises: a quiescent voltage supply for supplying a voltage at the quiescent level; and third switch means for selectively connecting the input node of the audio amplifier circuit or the quiescent voltage supply to the input of the voltage-gain amplifier, wherein the control circuit is arranged to control the third switch means when power is supplied by: prior to closing the first switch means, switching the third switch means to switch the quiescent voltage supply to the input of the voltage-gain amplifier; and on, or subsequent to, said switching of the second switch means to switch the inner feedback loop to the voltage-gain amplifier, switching the third switch means to switch the input node to the input of the voltage-gain amplifier.

This allows the voltage-gain amplifier to stabilise with the quiescent voltage being supplied to its input, thereby ensuring that it stabilises to its quiescent condition. The third switch means is subsequently switched to connect the input node to the voltage-gain amplifier for normal operation when the current-gain amplifier is switched on and the outer feedback loop around both amplifiers is switched to the voltage-gain amplifier.

Preferably, the audio amplifier circuit further comprises a charging path including resistance means for charging the output node of the audio amplifier circuit to its quiescent level through the resistance means; and a fourth switch means for selectively opening or closing the charging path, wherein the control circuit is arranged to control the fourth switch means when power is supplied by: closing the fourth switch means and subsequently, after a delay sufficient to allow the output node of the audio amplifier circuit to be charged to its quiescent level, opening the fourth switch means.

The charging path allows the output node of the audio amplifier circuit to be pre-charged to its quiescent level prior to the power supply being supplied to the current-gain amplifier. This means that on connection of the power supply to the current-gain amplifier its input and output are both at the quiescent voltage, thereby reducing the generation of audible noise on switching.

Desirably, the charging path is connected to a quiescent voltage supply for supplying a voltage at the quiescent level and the control means is arranged to control the fourth switch means when power is supplied by: initially opening the fourth switch means to isolate the output node of the audio amplifier circuit from the quiescent voltage supply; and performing said closing of the fourth switch means subsequently, after a delay sufficient to allow the output of the quiescent voltage supply to rise to its operating level.

This prevents the rise in the output of the quiescent voltage supply from creating audible noise at the output node of the audio amplifier circuit.

Preferably, the audio amplifier circuit further comprises a fifth switch means in series between the voltage-gain amplifier and the current-gain amplifier, and wherein the control means is arranged to control the fifth switch means when power is supplied by initially opening the fifth switch means to isolate the current-gain amplifier from the voltage-gain amplifier and subsequently, after a delay sufficient to allow the output of the power supply to rise to its operating level, closing the fifth switch means.

This prevents feedthrough of a signal from the voltage-gain amplifier during the rise in the level of the output of the power supply. Such a signal might otherwise drive the current-gain amplifier even whilst the power supply is disconnected therefrom and hence create audible noise at the output node.

Preferably, the audio amplifier circuit further comprises: a quiescent voltage supply for supplying voltage at the quiescent level to the forward path between the voltage-gain amplifier and the current-gain amplifier; a sixth switch means in series between the quiescent voltage supply and said forward path, wherein the control circuit is arranged to control the sixth switch means when power is supplied by: closing the sixth switch means to connect the quiescent voltage supply to the forward path and subsequently, after a delay sufficient to allow the output of the voltage-gain amplifier to stabilise, opening the sixth switch means.

This assists in causing the audio amplifier circuit to stabilise to its quiescent operating condition without the generation of audible noise, as a result of the output of the voltage-gain amplifier being driven to the quiescent voltage directly from the quiescent voltage supply.

Further, according to the first aspect of the present invention, there is provided an audio amplifier circuit comprising: a voltage-gain amplifier and a current-gain amplifier in series thereafter between an input node and an output node; power supply lines for supplying power to the audio amplifier circuit; an outer negative feedback loop around the current-gain amplifier and the voltage-gain amplifier; an inner negative feedback loop around the voltage-gain amplifier, the current-gain amplifier being outside the inner feedback loop; first switch means for selectively connecting the power supply lines to the current-gain amplifier; second switch means for selectively switching the inner feedback loop or the outer feedback loop to the voltage-gain amplifier; and a control circuit arranged to control the switch means during power supply switching, wherein the control circuit is arranged to control the switch means when power is removed by: switching the second switch means to switch the inner feedback loop to the voltage-gain amplifier and subsequently opening the first switch means to disconnect the power supply lines from the current-gain amplifier.

As a result of switching the outer feedback loop to the voltage-gain amplifier, the current-gain amplifier is in open loop when the power supply lines are disconnected. As a result, the removal of power from the current-gain amplifier does not create audible noise because its high bandwidth causes any transients to be above the audible range. In contrast, if the current-gain amplifier was in the feedback loop with the voltage-gain amplifier at this time, the low bandwidth of the voltage-gain amplifier would slow the power-down creating audible noise.

Preferably, the audio amplifier circuit further comprises a quiescent voltage supply for supplying a voltage at the quiescent level; and third switch means for selectively connecting the input node of the audio amplifier circuit or the quiescent voltage supply to the input of the voltage-gain amplifier, wherein the control circuit is arranged to control the third switch means when power is removed by: prior to, or on, said switching of the second switch means to switch the inner feedback loop to the voltage-gain amplifier, switching the third switch means to switch the quiescent voltage supply to the input of the voltage-gain amplifier.

This ensures that no audio signals are input to the audio amplifier circuit whilst power is removed, because such audio signals could cause the generation of audible noise as the power level falls.

Preferably, the audio amplifier circuit further comprises a charging path for holding the output node of the audio amplifier circuit to its quiescent level; and a fourth switch means for selectively opening or closing the charging path, wherein the control circuit is arranged to control the fourth switch means when power is removed by: prior to said opening of the first switch means, closing the fourth switch means.

The charging path holds the output node of the audio amplifier circuit at its quiescent level when the power supply lines are disconnected from the current-gain amplifier. This reduces the generation of audible noise when the power supply lines are disconnected.

Desirably, the charging path is connected to a quiescent voltage supply for supplying a voltage at the quiescent level and the control circuit is arranged to control the fourth switch means when power is removed by: subsequent to said opening of the first switch means, opening the fourth switch means to isolate the output node of the audio amplifier circuit from the quiescent voltage supply.

This prevents the fall in the output of quiescent voltage supply from creating audible noise at the output node of the audio amplifier circuit.

Preferably, the audio amplifier circuit further comprises a fifth switch means in series between the voltage-gain amplifier and the current-gain amplifier, and wherein the control means is arranged to control the fifth switch means when power is removed by: subsequent to said opening of the first switch means, opening the fifth switch means to isolate the current-gain amplifier from the voltage-gain amplifier.

This prevents feed-through of a signal from the voltage-gain amplifier during the fall in the level of the output of the power supply. Such a signal might otherwise drive the current-gain amplifier even whilst the power supply is disconnected therefrom and hence create audible noise at the output node.

Preferably, the audio amplifier circuit further comprises a quiescent voltage supply for supplying voltage at the quiescent level to the forward path between the voltage-gain amplifier and the current-gain amplifier; a sixth switch means in series between the quiescent voltage supply and said forward path, wherein the control circuit is arranged to control the sixth switch means when power is removed by: closing the sixth switch means to connect the quiescent voltage supply to the forward path.

According to a second aspect of the present invention, there is provided an audio amplifier circuit comprising: an amplifier circuit between an input node and an output node; power supply lines for supplying power to the audio amplifier circuit; a charging path including a resistance means for charging the output node to its quiescent voltage through the resistance means; charging path switch means for selectively opening and closing the charging path; a power supply switch means for selectively connecting the power supply lines to the output stage of the audio amplifier circuit; and a control circuit for controlling the power supply switch means and the charging path switch means when power is supplied by: initially opening the power supply switch means to disconnect the output stage of the amplifier circuit from the power supply lines; closing the charging path switch means and subsequently, after a delay sufficient for the output node to be charged to its quiescent voltage, opening the charging path switch means and closing the power supply switch means to connect the power supply lines to the output stage of the amplifier circuit.

The charging path allows the output node of the audio amplifier circuit to be charged to its quiescent level. During this charging, the output stage of the audio amplifier circuit is effectively off because its power supply is disconnected. When the power supply is connected to the output stage of the audio amplifier circuit, the amount of noise generated is reduced, because the output node has already been charged to its quiescent level.

The power supply switch means may selectively connect the power supply lines to all of the audio amplifier circuit including elements before the output stage, but preferably this is not the case, so that the remainder of the audio amplifier circuit receives power as soon as power is supplied to the power supply lines. This allows the remainder of the audio amplifier circuit to stabilise to its quiescent operating condition before power is supplied to the output stage.

Desirably, with both the aspects of the present invention, the current-gain amplifier has no inherent DC offset between its input and output. This means that when the power supply is connected to the current-gain amplifier, there is no step in the output voltage which could create an audible noise.

The two aspects of the present invention may be implemented together, as in the hereinafter described embodiment. The various features of the two aspects of the present invention may be freely combined together.

As described above, both aspects of the present invention reduce the audible noise generated during power supply switching.

Both the aspects of the present invention the audio amplifier circuit of the present invention may be implemented in a single integrated circuit chip. This makes it possible to provide an IC chip incorporating an audio amplifier circuit in which audible noise on power supply switching is reduced without the necessity to implement a further circuit external to the IC chip. This avoids the need for further noise reduction techniques to be employed when the IC chip is incorporated into a larger circuit and also minimises the circuit scale.

The audio amplifier circuit may be used in any device where it is necessary to amplify an audio signal. For example, it may be used in an audio-visual switch.

An audio amplifier circuit which embodies both the aspects of the present invention will now be described by way of non-limitative example with reference to the accompanying drawings in which:

DETAILED DESCRIPTION OF THE PREFERRED EMBODIMENTS

Figure 1:
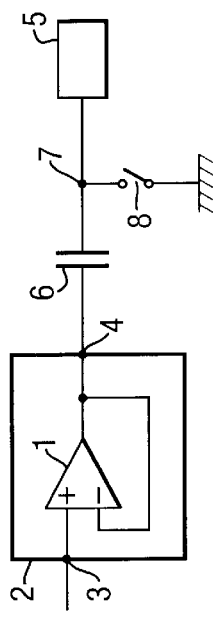
FIG. 1 is a circuit diagram of a known audio amplifier circuit employing an external switch for eliminating noise during power supply switching.
Figure 2:
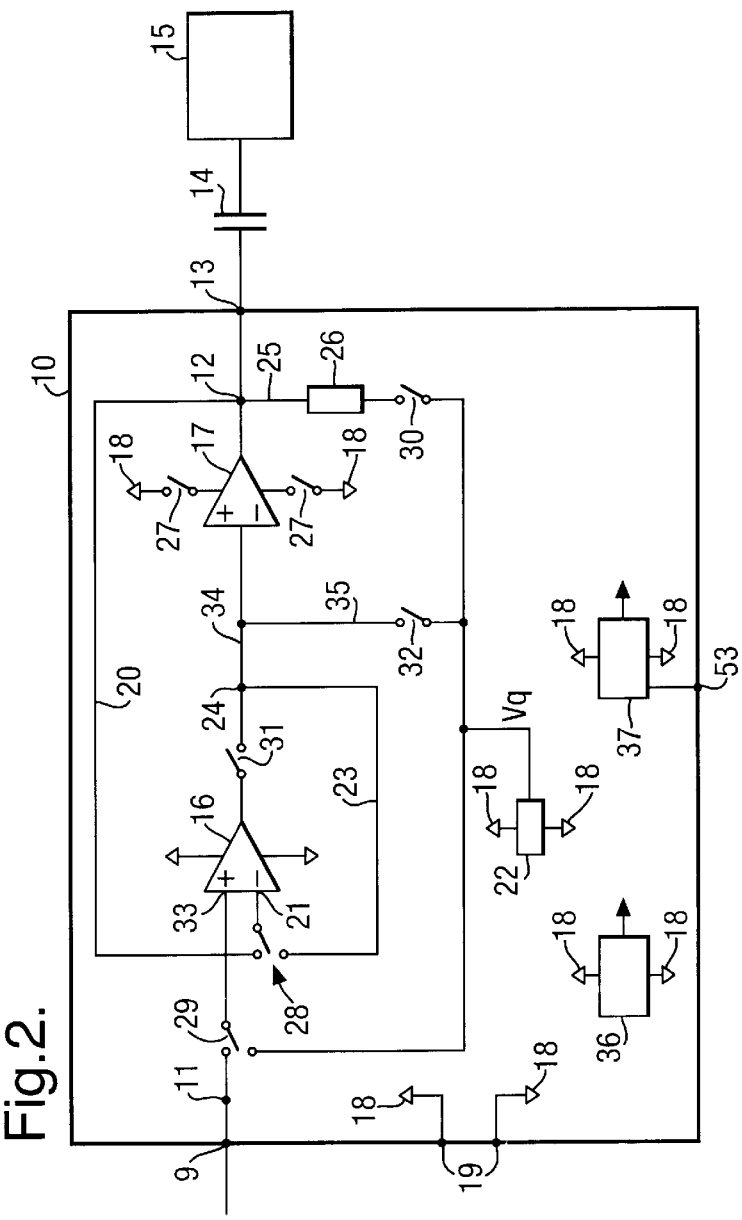
FIG. 2 is an audio amplifier circuit in accordance with the present invention.

FIG. 2 illustrates an audio amplifier circuit which embodies both the aspects of the present invention and is formed in an integrated circuit (IC) chip 10. The audio amplifier circuit amplifies audio signals supplied to an input node 11 via an input terminal 9 of the IC chip 10 and outputs amplified audio signals at the output node 12 through an output terminal 13 of the IC chip 10. The output terminal 13 is connected through an external capacitor 14 provided for DC isolation to a load 15 which may be a loudspeaker or may be a further audio circuit or device connected intermediate the audio amplifier circuit and a loudspeaker. For example, the IC chip 10 and external capacitor 14 may form part of an audio-visual switch with the load 15 being a loudspeaker connected thereto.

For amplification of the input audio signals, the audio amplifier circuit includes a voltage-gain amplifier 16 and a current-gain amplifier 17 in series thereafter in the forward path between the input node 11 and the output node 12.

Power is supplied to power supply lines 18 through power supply terminals 19. The power supply lines 18 are connected to the various components of the power audio amplifier circuit to supply power in a conventional manner.

An outer feedback loop 20 is provided around the voltage-gain amplifier 16 and the current-gain amplifier 17 from the output node 12 to the inverting input 21 of the voltage-gain amplifier 16. The outer negative feedback loop 20 provides negative feedback in a conventional manner during normal operation of the audio amplifier circuit to amplify audio signals.

The elements of the audio amplifier circuit described above are of conventional construction. In addition, the audio amplifier circuit has the following components for eliminating noise when the power supply is switched.

The audio amplifier circuit includes a quiescent voltage supply circuit 22 for deriving a quiescent voltage $V_q$ from the voltages on the power supply lines 18. A charging path 25 including a resistance 26 is connected between the quiescent voltage supply 22 and the output node 12 for charging the output node 12 with the quiescent voltage $V_q$ through the resistance 26.

The audio amplifier circuit also includes an inner feedback loop 23 around the voltage-gain amplifier 16. The inner feedback loop 23 is connected from an intermediate node 24 between the voltage-gain amplifier 16 and the current-gain amplifier 17 so that the current-gain amplifier 17 is outside the inner negative feedback loop 23.

The audio amplifier circuit also includes a number of switches as follows.

A first, double switch 27 is provided between the power supply lines 18 and the current-gain amplifier 17 for controlling the supply of power to the current-gain amplifier 17.

A second switch 28 is provided for selectively connecting the outer feedback loop 20 or the inner feedback loop 23 to the inverting input 21 of the voltage-gain amplifier 16.

A third switch 29 is arranged to selectively connect the quiescent voltage supply 22 or the input node 11 to the non-inverting input 33 of the voltage-gain amplifier 16.

A fourth switch 30 is provided in the charging path 25 for selectively opening and closing the charging path 25.

A fifth switch 31 is connected in series between the voltage-gain amplifier 16 and the current-gain amplifier 17 for selectively opening and closing the forward path 34 between the two amplifiers 16 and 17. The fifth switch 31 is illustrated in FIG. 2 as being connected between the output of the voltage-gain amplifier 16 and the node 24 so that the fifth switch 31 is within the inner feedback loop 23. However, the fifth switch 31 may equally be provided after the node 24 so that it is outside the inner negative feedback loop 23.

A sixth switch 32 is provided for opening and closing a line 35 connected from the quiescent voltage supply 22 to the forward path 34 between the voltage-gain amplifier 16 and the current-gain amplifier 17 for selectively supplying the quiescent voltage to the forward path 34.

The first six switches 27 to 32 are implemented simply by transistors in the IC chip 10. However they may be replaced by any circuit capable of performing the required switching.

The IC 10 further includes a power-on-reset circuit 36 and a timing generator circuit 37 which together act as a control circuit for the six switches 27 to 32. In particular, the power-on reset circuit 36 resets the initial state of the switches when power is supplied to the power supply lines 18 before any of the other circuit elements of the audio amplifier circuit operate. Similarly, the timing generator circuit 37 generates switching control signals to switch the six switches 27 to 32 at predetermined timings after the power is supplied to, or removed from, the power supply lines 18. The control signals at the predetermined timings may be generated in response to a control signal supplied to a control terminal 53 on the IC 10 prior to power being supplied to, or removed from, the power supply lines 18. The timings may be generated in any convenient manner, for example by taking the signals from the nodes in a resistance ladder through which a capacitor is charged.

As an alternative, the timing generator circuit 37 may be replaced by a logic interface connected to a terminal of the IC chip 10 to receive a series of timing signals supplied to the control terminal 53 from a microprocessor external of the IC chip 10 and to control the switches 27 to 32 at the correct timings in response to those timing signals.

In another alternative, the timing generator circuit 37 does not respond to signals supplied to the control terminal 53, but responds to the power level on supply lines 18, when power is supplied to the supply lines 18, the timing generator circuit 37 responds to generate the control signals at the correct timings thereafter. To generate the control signals at the correct timings prior to removal of power, the timing generator circuit 37 has a pre-trigger sensitive to an initial reduction in the voltage level on the supply lines 18. In this case, the voltage level on the supply lines 18 must have a controlled decay rate sufficiently slow to allow correct operation of the switches 27 to 32 prior to complete removal of power.

In particular the switches are controlled when power is supplied to the IC chip 10 as follows.

When power is supplied to the power supply lines 18, the power-on reset circuit 36 initialises the state of the six switches 27 to 32 as follows:

the first switch 27 is open;
the second switch 28 is switched to connect the inner negative feedback loop 23 to the voltage-gain amplifier 16;
the third switch 29 is switched to connect the quiescent voltage $V_q$ to the input of the voltage-gain amplifier 16;
the fourth switch 30 is open;
the fifth switch 31 is open; and
the sixth switch 32 is closed.

The purpose of initially opening the first switch 27 is to delay the supply of power to the current-gain amplifier 17 whilst the voltage-gain amplifier 16 is brought into its stable quiescent condition.

The purpose of initially opening the fifth switch 31 is to isolate the output of the voltage-gain amplifier 16 from the current-gain amplifier 17 and hence prevent feedthrough of signals generated in the voltage-gain amplifier 16 while the power supply rises to its operating level. Such signals could cause the current-gain amplifier 17 to generate audible noise at its output even though the current-gain amplifier 17 has no power supply connected. Therefore the fifth switch 31 eliminates such noise. Subsequent to power being supplied, the timing generator circuit 37 closes the fifth switch 31, so that the output of the voltage-gain amplifier 16 is connected to the input of the current-gain amplifier 17.

The purpose of the initial setting of the second switch 28 is to allow the voltage-gain amplifier 16 to stabilise to its quiescent operating condition via the inner feedback loop 23.

The purpose of the initial setting of the third switch 29 is to supply the quiescent voltage to the input of the voltage-gain amplifier 16 during the switching arrangement. This allows the voltage-gain amplifier 16 to stabilise without being disrupted by an audio signal supplied to the input node 11.

The purpose of initially closing the sixth switch 32 is to supply the quiescent voltage from the quiescent voltage supply 22 directly to the output of the voltage-gain amplifier 16. Thus while the voltage-gain amplifier 16 is stabilising there are two influences driving it to its quiescent operating condition. The first influence is the feedback provided through the inner negative feedback loop 23. The second influence is the effect of the quiescent voltage supplied directly to the output of the voltage-gain amplifier 16 through the sixth switch 32 which effectively pre-charges the forward path 34 and the output of the voltage-gain amplifier 16 to its quiescent level.

The charging path 25 is provided to charge the output node 12 to the quiescent voltage prior to connecting the power supply to the current-gain amplifier 17. However, the purpose of initially opening the fourth switch 30 is to isolate the output node 12 from the quiescent voltage supply 22 to prevent the generation of noise at the output node 12 whilst the output of the quiescent voltage supply rises to its operating level. Therefore, after a delay sufficient for the output of the quiescent voltage supply to rise to its operating level, the timing generator circuit 37 closes the fourth switch 30. This causes the output node 12 to be charged through the charging path 25 to the quiescent voltage $V_q$ from the quiescent voltage supply 22. This charging occurs through the resistance 26 which is selected to be sufficiently large with respect to the capacitance of the external capacitor 14 that the charging transient of the output node 12 is below the audible range. Hence the charging of the output node 12 does not create any audible noise. After a delay sufficient to charge the output node 12, the timing generator circuit 37 opens the fourth switch 30.

As previously noted, the purpose of the external capacitor 14 is to provide DC isolation of the audio amplifier circuit from the node 15. Therefore in the case that the power supply is a dual supply so that the quiescent voltage of the output node 12 is ground, the external capacitor 14 may in principle be removed as no DC isolation is needed. In that case, the provision of the charging path 25 is not essential as the output node 12 should already be at the quiescent voltage, that is ground. However, it would still be desirable to provide a charging path 25 to pre-charge the output node 12 in case this is not at the expected quiescent level when the power is supplied.

The subsequent control of the six switches 27 to 32 by the timing generator circuit 37 is as follows.

After a delay sufficient for the voltage-gain amplifier 16 to stabilise to its quiescent operating condition, the sixth switch 32 is opened, because the voltage-gain amplifier will now hold the quiescent voltage at its output due to the action of the negative feedback loop 23.

On, or subsequent to, opening of the sixth switch 32 (that is after a delay sufficient for the voltage-gain amplifier to stabilise and preferably also sufficient for the output node 12 to be charged to its quiescent level), the first switch 27 is closed to connect the power supply lines 18 to the current-gain amplifier 17. By this time, the input of the current-gain amplifier 17 has been forced to the quiescent level through the action of the voltage-gain amplifier 16 and the inner feedback loop 23. Similarly, the output of the current-gain amplifier 17 has been forced to the quiescent level due to the charging of the output node 12. Thus as the input and output of the current-gain amplifier have been forced to the quiescent level, connection of the power supply lines to the current-gain amplifier 17 simply turns on the elements of the current-gain amplifier 17 without the generation of noise. Thus delaying the supply of power to the current-gain amplifier 17 until its input and output have been forced to the quiescent level eliminates the noise which would be generated in the current-gain amplifier 17 due to mis-match between the rise transients of the positive and negative power supplies. Closing of the first switch 27 does create a brief switching transient, but this is above the audible range.

Such rapid power-up is possible because the current-gain amplifier 17 is in open loop when it is switched on as a result of the initial setting of the second switch 28. Hence the high bandwidth of the current-gain amplifier allows rapid power-up. If the current-gain amplifier 17 were switched on with a feedback loop around both the voltage-gain amplifier 16 and the current-gain amplifier 17 then low bandwidth of the voltage-gain amplifier 16 would slow down the turn-on of the current-gain amplifier 17 sufficiently to create audible noise at the output node 12, essentially because of the delay in charging the capacitance inherent in the voltage-gain amplifier 16.

Once the current-gain amplifier 17 is on, it needs to be brought back into a negative feedback loop with the voltage-gain amplifier 16 for normal operation of the audio amplifier circuit 16. To achieve this, after the first switch 27 has been closed, the second switch is switched to connect the outer feedback loop 20 to the voltage-gain amplifier 16. At the same time, or subsequently, the third switch 29 is switched to connect the input node 11 to the voltage-gain amplifier 16. Switching of the second switch 28 and the third switch 29 create fast output transients, but these are above the audible range. The switching cycle when power is supplied to the IC chip 10 has now finished and the audio amplifier circuit operates to amplify audio signals supplied to the input node 11.

When the power supply is removed from the IC chip 10, the timing generator circuit 37 switches the six switches 27 to 32 in the reverse order from when power is supplied, that is as follows.

Firstly, the third switch 29 is switched to connect the quiescent voltage $V_q$ from the quiescent voltage supply 22 to the non-inverting input 33 of the voltage-gain amplifier 16. This disconnects the voltage-gain amplifier 16 and the remainder of the audio amplifier circuit from the input node 11, so that input audio signals to not disrupt a smooth reduction in the power levels. Otherwise input audio signals could cause the generation of audible noise.

At the same time, or subsequent to, switching of the third switch 29, the second switch 28 is switched to connect the inner feedback loop 23 to the inverting input 21 of the voltage-gain amplifier 16. This is to disconnect of the outer feedback loop 20 and hence place the current-gain amplifier 17 in open-loop. At this time, the fourth switch 30 is closed so that the output of the current-gain amplifier 17 is held at the quiescent level. The input of the current-gain amplifier 17 is also held at the quiescent level by the voltage-gain amplifier 16 due to the operation of the inner feedback loop 23.

Next, the first switch 27 is opened to disconnect the power supply lines 18 from the current-gain amplifier 17. As a result of the input and output of the current-gain amplifier 17 being forced to the quiescent level, the elements of the current-gain amplifier 17 simply turn off without the generation of noise. Since the current-gain amplifier 17 is in open-loop outside the inner feedback loop 23 connected around the voltage-gain amplifier 16, the high bandwidth of the current-gain amplifier allows this switch-off to be quick. In other words the switch-off of the current-gain amplifier 17 is not affected by the low bandwidth of the voltage-gain amplifier 16 caused by its inherent capacitance which would cause the elements of the current-gain amplifier 17 to turn off more slowly, thereby generating audible noise.

Subsequently, the fourth switch 30 is opened to disconnect the output node 12 from the quiescent voltage supply 22, so that the fall of the quiescent voltage $V_q$ from its normal operating level after removal of power does not create audible noise at the output node 12.

Finally, the sixth switch 32 is closed to connect the forward path 34 between the voltage-gain amplifier 16 and the current-gain amplifier 17 to the quiescent voltage supply 22 and subsequently, the fifth switch 31 is opened to isolate the current-gain amplifier 17 from the voltage-gain amplifier 16. In this state, the power is removed from the IC chip 10. As a result of the fifth switch 32 being open, any signals generated at the output of the voltage-gain amplifier 16 are prevented from feeding through to the current-gain amplifier 17 where they could drive it to generate audible noise at the output node 12 even though the current-gain amplifier 17 is off.

Figure 3:
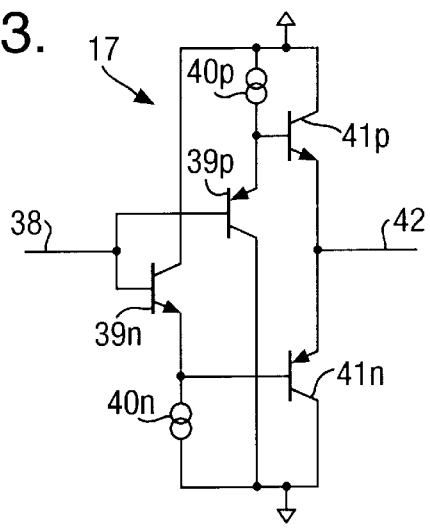
FIG. 3 is a circuit diagram of a current-gain amplifier usable in the audio amplifier circuit of FIG. 2.

The current-gain amplifier 17 may have a conventional arrangement as illustrated in FIG. 3. In this arrangement, the current-gain amplifier 17 has a positive current leg and a negative current leg implemented by the same arrangement of transistors but with NPN transistors replacing PNP transistors and vice versa. The corresponding elements of each leg are distinguished in FIG. 3 by the subscripts p and n respectively. Each leg is arranged as follows.

The input of the current-gain amplifier 17 is connected to the base of an input transistor 39, the emitter of which is connected to a current source 40. The emitter of the input transistor 39 is also connected to the base of an output transistor 41. The output transistor 41 is of the opposite type from the input transistor 39 and has its emitter connected to the output 42 of the current-gain amplifier 17. Consequently the current-gain amplifier 17 amplifies currents supplied at the input 38 with the output transistor 41p of the positive leg driving positive current flow at the output 42 and the output transistor 41n of the negative current leg driving negative current at the output 42.

However, there will inevitably be a small DC offset between the output 42 and the input 38 as a result of the NPN, PNP mis-match, that is mis-match between the voltage drops across the base-emitter junctions of the input transistor 39 and the output transistor 41. This will result in an unwanted transient step at the output when the power supply is connected to the current-gain amplifier 17, thereby causing a small audible noise.

Figure 4:
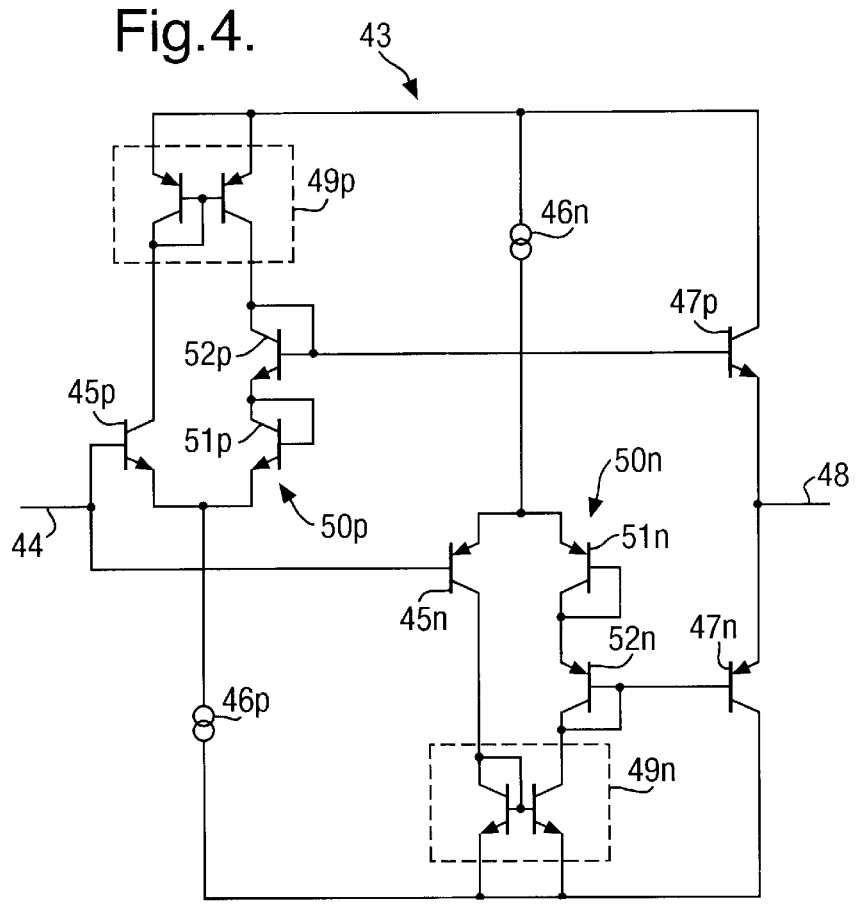
FIG. 4 is a circuit diagram of an alternative current-gain amplifier having no inherent DC offset.

To eliminate this source of audible noise, the current-gain amplifier 17 may be replaced by a current-gain amplifier having zero DC offset between its input and output, for example, the alternative current-gain amplifier 43 illustrated in FIG. 4. The alternative current-gain amplifier 43 again has two legs with identical arrangements of transistors except with PNP transistors replaced by NPN transistors and vice versa. The corresponding elements of each leg are again distinguished by the subscripts p and n. Each leg is arranged as follows.

The current-gain amplifier 43 of FIG. 4 has an input 44 connected to the base of an input transistor 45, the emitter of which is connected to a constant current source 46. Again, the input transistor 45 drives the base of an output transistor 47, the emitter of which is connected to the output 48. However, the input transistor 45 does not drive the output transistor 47 directly. Instead a current mirror 49 is used to mirror the current flowing into the collector of the input transistor 45 through a parallel path 50 parallel to the collector-emitter of the input transistor 51.

The parallel path 50 includes two diode-connected, matching transistors 51 and 52 in series. The base of the output transistor 47 is connected to the base of the second matching transistor 52. The first matching transistor 51 is of the same type as the input transistor and the second matching transistor 52 is of the same type as the output transistor 47. Consequently the voltage drops across the base-emitter junctions of the input transistor 45 and the first matching transistor 51 are identical. Similarly, the voltage drops across the base-emitter junctions of the output transistor 47 and the second matching transistor 52 are also identical. As a result, there is no DC offset between the input 44 and the output 48 of the current-gain amplifier 43.

The IC chip 10 is preferably implemented using bipolar technology as in the current-gain amplifiers 17 and 43 of FIGS. 3 and 4. However it may equally be implemented by the equivalent field-effect transistor arrangement.

What is claimed is:

1. An audio amplifier circuit comprising:
   a voltage-gain amplifier and a current-gain amplifier in series thereafter between an input node and an output node;
   power supply lines for supplying power to the audio amplifier circuit;
   an outer negative feedback loop around the current-gain amplifier and the voltage-gain amplifier;
   an inner negative feedback loop around the voltage-gain amplifier, the current-gain amplifier being outside the inner negative feedback loop;
   first switch means for selectively connecting the power supply lines to the current-gain amplifier;
   second switch means for selectively switching the inner feedback loop or the outer feedback loop to the voltage-gain amplifier; and
   a control circuit arranged to control the switch means during power supply switching,
   wherein the control circuit is arranged to control the switch means when power is supplied by:
      initially opening the first switch means to disconnect the power supply lines from the current-gain amplifier;
      switching the second switch means to switch the inner negative feedback loop to the voltage-gain amplifier and subsequently, after a delay sufficient to allow the output of the voltage-gain amplifier to stabilise, closing the first switch means to connect the power supply lines to the current-gain amplifier; and
      switching the second switch means to switch the outer negative feedback loop to the voltage-gain amplifier.

2. An audio amplifier circuit according to claim 1, further comprising:
   a quiescent voltage supply for supplying a voltage at the quiescent level; and
   third switch means for selectively connecting the input node of the audio amplifier circuit or the quiescent voltage supply to the input of the voltage-gain amplifier,
   wherein the control circuit is arranged to control the third switch means when power is supplied by:
      prior to closing the first switch means, switching the third switch means to switch the quiescent voltage supply to the input of the voltage-gain amplifier; and
      on, or subsequent to, said switching of the second switch means to switch the inner negative feedback loop to the voltage-gain amplifier, switching the third switch means to switch the input node to the input of the voltage-gain amplifier.

3. An audio amplifier circuit according to claim 1, further comprising:
   a charging path including resistance means for charging the output node of the audio amplifier circuit to its quiescent level through the resistance means; and
   a fourth switch means for selectively opening or closing the charging path,
   wherein the control circuit is arranged to control the fourth switch means when power is supplied by:
      closing the fourth switch means and subsequently, after a delay sufficient to allow the output node of the audio amplifier circuit to be charged to its quiescent level, opening the fourth switch means.

4. An audio amplifier circuit according to claim 3, wherein the charging path is connected to a quiescent voltage supply for supplying a voltage at the quiescent level and the control means is arranged to control the fourth switch means when power is supplied by:
   initially opening the fourth switch means to isolate the output node of the audio amplifier circuit from the quiescent voltage supply; and
   performing said closing of the fourth switch means subsequently, after a delay sufficient to allow the output of the quiescent voltage supply to rise to its operating level.

5. An audio amplifier circuit according to claim 3, wherein the output node is connected to an external capacitor, and the resistance of the resistance means is sufficiently high with respect to the capacitance of the capacitor that the charging transient of the output node is below the audible range.

6. An audio amplifier circuit according to claim 1, further comprising a fifth switch means in series between the voltage-gain amplifier and the current-gain amplifier, and wherein the control means is arranged to control the fifth switch means when power is supplied by initially opening the fifth switch means to isolate the current-gain amplifier from the voltage-gain amplifier and subsequently, after a delay sufficient to allow the output of the power supply to rise to its operating level, closing the fifth switch means.

7. An audio amplifier circuit according to claim 1, further comprising:
 a quiescent voltage supply for supplying voltage at the quiescent level to a forward path between the voltage-gain amplifier and the current-gain amplifier;
 a sixth switch means in series between the quiescent voltage supply and said forward path,
 wherein the control circuit is arranged to control the sixth switch means when power is supplied by:
  closing the sixth switch means to connect the quiescent voltage supply to the forward path and subsequently, after a delay sufficient to allow the output of the voltage-gain amplifier to stabilise, opening the sixth switch means.

8. An audio amplifier circuit according to claim 1, wherein the current-gain amplifier has no inherent DC offset between its input and output.

9. An audio amplifier circuit according to claim 1, wherein the audio amplifier circuit is formed in a single integrated circuit chip.

10. An audio amplifier circuit according to claim 1, wherein the control circuit includes a power-on reset circuit for setting the initial state of the switch means.

11. An audio amplifier circuit according to claim 10, wherein the control circuit includes a timing generator circuit arranged to control the switch means at predetermined timings in response to power being supplied.

12. An audio amplifier circuit comprising:
 a voltage-gain amplifier and a current-gain amplifier in series thereafter between an input node and an output node;
 power supply lines for supplying power to the audio amplifier circuit;
 an outer negative feedback loop around the current-gain amplifier and the voltage-gain amplifier;
 an inner negative feedback loop around the voltage-gain amplifier, the current-gain amplifier being outside the inner negative feedback loop;
 first switch means for selectively connecting the power supply lines to the current-gain amplifier;
 second switch means for selectively switching the inner negative feedback loop or the outer negative feedback loop to the voltage-gain amplifier; and
 a control circuit arranged to control the switch means during power supply switching,
 wherein the control circuit is arranged to control the switch means when power is removed by:
  switching the second switch means to switch the inner negative feedback loop to the voltage-gain amplifier and subsequently opening the first switch means to disconnect the power supply lines from the current-gain amplifier.

13. An audio amplifier circuit according to claim 12, further comprising:
 a quiescent voltage supply for supplying a voltage at the quiescent level; and
 third switch means for selectively connecting the input node of the audio amplifier circuit or the quiescent voltage supply to the input of the voltage-gain amplifier,
 wherein the control circuit is arranged to control the third switch means when power is removed by:
  prior to, or on, said switching of the second switch means to switch the inner negative feedback loop to the voltage-gain amplifier, switching the third switch means to switch the quiescent voltage supply to the input of the voltage-gain amplifier.

14. An audio amplifier circuit according to claim 12, further comprising:
 a charging path for holding the output node of the audio amplifier circuit to its quiescent level; and
 fourth switch means for selectively opening or closing the charging path,
 wherein the control circuit is arranged to control the fourth switch means when power is removed by:
  prior to said opening of the first switch means, closing the fourth switch means.

15. An audio amplifier circuit according to claim 14, wherein the charging path is connected to a quiescent voltage supply for supplying a voltage at the quiescent level and the control circuit is arranged to control the fourth switch means when power is removed by:
 subsequent to said opening of the first switch means, opening the fourth switch means to isolate the output node of the audio amplifier circuit from the quiescent voltage supply.

16. An audio amplifier circuit according to claim 12, further comprising fifth switch means in series between the voltage-gain amplifier and the current-gain amplifier, and
 wherein the control means is arranged to control the fifth switch means when power is removed by:
  subsequent to said opening of the first switch means, opening the fifth switch means to isolate the current-gain amplifier from the voltage-gain amplifier.

17. An audio amplifier circuit according to claim 12, further comprising:
 a quiescent voltage supply for supplying voltage at the quiescent level to the forward path between the voltage-gain amplifier and the current-gain amplifier;
 sixth switch means in series between the quiescent voltage supply and said forward path,
 wherein the control circuit is arranged to control the sixth switch means when power is removed by:
  closing the sixth switch means to connect the quiescent voltage supply to the forward path.

18. An audio amplifier circuit comprising:
 an amplifier circuit between an input node and an output node;
 power supply lines for supplying power to the audio amplifier circuit;
 a charging path including resistance means for charging the output node to its quiescent voltage through the resistance means;
 charging path switch means for selectively opening and closing the charging path;
 power supply switch means for selectively connecting the power supply lines to an output stage of the audio amplifier circuit; and
 a control circuit for controlling the power supply switch means and the charging path switch means when power is supplied by:
  initially opening the power supply switch means to disconnect the output stage of the amplifier circuit from the power supply lines; closing the charging path switch means and subsequently, after a delay sufficient for the output node to be charged to its quiescent voltage, opening the charging path switch means and closing the power supply switch means to connect the power supply lines to the output stage of the amplifier circuit.

19. An audio amplifier circuit according to claim 18, wherein the output node is connected to an external capacitor, and a resistance of the resistance means is sufficiently high with respect to a capacitance of the external capacitor that a charging transient of the output node is below an audible range.

20. An audio amplifier circuit according to claim 18, wherein the output stage of the amplifier circuit is a current-gain amplifier.

21. An audio amplifier circuit according to claim 20, wherein the current-gain amplifier has no inherent DC offset between its input and output.

22. An audio amplifier circuit according to claim 18, wherein the audio amplifier circuit is formed in a single integrated circuit chip.

23. An audio amplifier circuit according to claim 18, wherein the control circuit includes a power-on reset circuit for setting the initial state of the switch means.

24. An audio amplifier circuit according to claim 23, wherein the control circuit includes a timing generator circuit arranged to control the switch means at predetermined timings in response to power being supplied.

* * * * *